United States Patent
Knoke et al.

(10) Patent No.: US 7,351,919 B1
(45) Date of Patent: Apr. 1, 2008

(54) PORT COVER FOR LIMITING TRANSFER OF ELECTROMAGNETIC RADIATION FROM A PORT DEFINED IN A HOST DEVICE

(75) Inventors: Kevin Charles Knoke, Fishers, IN (US); Will Allen Bishop, Noblesville, IN (US)

(73) Assignee: Thomson Licensing, Boulogne Billancourt (FR)

( * ) Notice: Subject to any disclaimer, the term of this patent is extended or adjusted under 35 U.S.C. 154(b) by 1598 days.

(21) Appl. No.: 10/031,098

(22) PCT Filed: Jun. 23, 2000

(86) PCT No.: PCT/US00/17395

§ 371 (c)(1),
(2), (4) Date: Jan. 10, 2002

(87) PCT Pub. No.: WO01/06782

PCT Pub. Date: Jan. 25, 2001

Related U.S. Application Data

(60) Provisional application No. 60/143,844, filed on Jul. 15, 1999.

(51) Int. Cl.
*H05K 9/00* (2006.01)

(52) U.S. Cl. ...................................... 174/382; 174/377
(58) Field of Classification Search ................ 174/350, 174/377, 382; 344/550; 361/816, 818
See application file for complete search history.

(56) References Cited

U.S. PATENT DOCUMENTS

| 5,353,350 A | | 10/1994 | Unsworth et al. ............. 380/3 |
| 5,761,054 A | * | 6/1998 | Kuhn .......................... 361/818 |
| 5,796,335 A | | 8/1998 | Droege et al. ............. 340/550 |
| 5,907,620 A | * | 5/1999 | Klemba et al. ............. 713/189 |
| 6,235,985 B1 | * | 5/2001 | Dai ............................ 174/359 |
| 6,266,416 B1 | * | 7/2001 | Sigbjornsen et al. ........ 380/255 |
| 2004/0206815 A1 | * | 10/2004 | Tarnovsky et al. .......... 235/382 |

FOREIGN PATENT DOCUMENTS

| DE | 3110670 | 9/1982 |
| EP | 0675455 | 10/1995 |
| EP | 0706291 | 4/1996 |
| GB | 2077013 | 12/1981 |

\* cited by examiner

*Primary Examiner*—Hung V. Ngo
(74) *Attorney, Agent, or Firm*—Joseph J. Laks; Paul P. Kiel

(57) ABSTRACT

A port cover for covering a port formed in a host device, the port cover includes a bottom portion, a plurality of side portions, and couplers to attach the sides to a host device, where said couplers attach on either side of the port.

10 Claims, 2 Drawing Sheets

PORT COVER FOR LIMITING TRANSFER OF ELECTROMAGNETIC RADIATION FROM A PORT DEFINED IN A HOST DEVICE

This application claims the benefit under 35 U.S.C. § 365 of International Application PCT/US00//17395, filed Jun. 23, 2000, which was published in accordance with PCT Article 21(2) on Jan. 25, 2001 in English; and which claims benefit of U.S. provisional application Ser. No. 60/143,844 filed Jul. 15, 1999.

BACKGROUND OF THE DISCLOSURE

1. Field of the Invention

The invention relates to host devices. More particularly, the invention relates to a port cover for a host device.

2. Description of the Prior Art

Smart cards, and other similar information-storing devices, are known for their capabilities in storing information relating to stored funds, personal identification and other personal data, descrambling keys and an ability to access certain host devices. When multiple users share a common host device, each user may have a separate smart card having selected limitations, these limitations are triggered, e.g., when one user's smart card is removed from a host device and another user's smart card is inserted into the host device.

It is difficult to provide an interface between smart cards and certain host devices that emit certain ranges of electromagnetic radiation. For example, satellite receivers formed as set top boxes are configured as enclosed boxes with an electromagnetic/radio frequency interference shield (EMI/RFI shield) entirely covering each wall of the satellite receiver. If a satellite receiver is provided with a smart card port to provide access to the smart card, the smart card port would provide an opening in which little or no EMI/RFI shield would exist. With a lack of an EMI shield over even a portion of the host device, electromagnetic interference (EMI), possibly including radio frequency interference (RFI), could escape from the satellite receiver into the surrounding space. This large emission of EMI is unacceptable, since it does not conform with industry standards and can result in interference applied to electronic equipment located in the vicinity.

It would be desirable to provide a configuration for a host device having a smart card port in which the entire satellite receiver can be shielded to limit emissions of EMI generated by the host device into the surrounding areas.

Hackers present another concern by attempting to "use" information obtained from other smart cards. One technique that accomplishes this unauthorized accessing of information is referred to as hot-wiring a smart card. This hot-wiring is accomplished by affixing a single wire to each smart card contact. The smart card is then inserted into the host device and the host device begins to interact with the smart card with the hot-wiring wire extending out of the port. During this interaction, confidential information may be electronically transferred between the host device and the smart card, and thereby is also transmitted outside of the host device through the hot-wiring wires, via the port. If a hacker uses suitable equipment outside the host device, the hacker can obtain much of the confidential information that is on the smart card, and can also produce a copy of the smart card that might be used in place of the original.

Therefore, a need exists in the art for a device to limits hot-wiring of the smart card. This device will improve security associated therewith by preventing unauthorized use of access codes and breach of confidentiality, thereby improving user confidence in, and acceptance of, the system.

SUMMARY OF THE INVENTION

The present invention relates to a port cover for covering the port formed in a host device, the port cover includes a bottom portion, a plurality of side portions, and couplers to attach the sides to a host device, where said couplers attach on either side of the port.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

After considering the following description, those skilled in the art will clearly realize that the teachings of the invention can be readily utilized in satellite/TV receiver systems, or any other host device that uses a smart card or other similar information-storing device.

Figure 1:
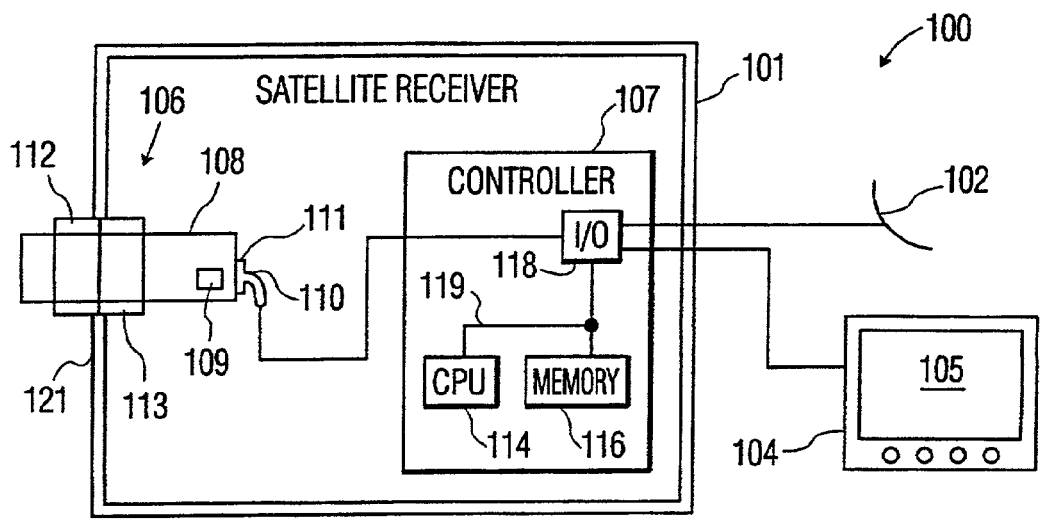
FIG. 1 shows a schematic diagram of a satellite/TV receiver system in accordance with one embodiment of the present invention.

FIG. 1 shows a typical satellite/TV receiver system 100 that includes a satellite receiver 101, a satellite dish 102, and a television 104. The integration and operation of system 100 (particularly controller 107, CPU 114, memory 116, I/O 118 and bus 119) is well known and thus is not described herein Satellite receiver 101 includes smart card portion 106 and controller portion 107. Smart card portion 106 includes the removable smart card 108, a smart card port 112, a smart card collar 113, and a smart card reader 110. The smart card reader 110 includes smart card reader head 111. In one embodiment, the smart card 108 includes a smart card operating patch 109. The smart card port 112 permits insertion of, and removal of, different selected smart cards through the smart card port 112. Smart card collar 113 retains the smart card 108 in position when a smart card 108 is inserted through the smart card port 112. The smart card port 112 is formed in a housing 121 that defines the outer surface of the satellite receiver 101.

Figure 2:
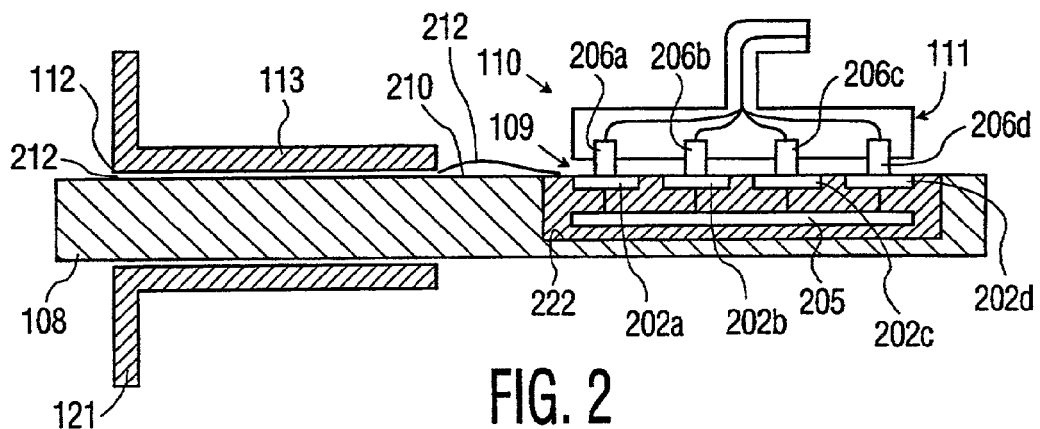
FIG. 2 shows a cross sectional expanded view of a smart card inserted into a host device in accordance with one embodiment of the present invention.

Smart card 108 is further detailed in cross section in FIG. 2. Smart card operating patch 109, formed on an external surface of smart card 108, includes smart card contacts 202a, 202b, 202c, and 202d, integrated circuit 205, and insulative material 204 (e.g., resin) that secures contacts 202 in position. Each smart card contact is electrically connected by conductors to integrated circuit 205. The surface of each smart card contact is exposed to an external surface 201 of smart card 108 at smart card operating patch 109 such that an electric probe touching the exposed surface at each smart card contact can transmit signals to, and receive signals from, the integrated circuit 205. The primary function of integrated circuit 205 (which may be an application specific integrated circuit) is to store information (some of which may be modified). The information that is to be saved may include monetary amounts, programming capabilities, individual and address information, and other such information, such as descrambling keys.

The smart card reader 110 is also depicted in FIG. 2 in a position that it would be when interacting with the smart card contacts. The smart card reader 110 includes a plurality of smart card contacts 206a, 206b, 206c, and 206d which electrically connect to smart card contacts 202a, 202b, 202c, and 202d, respectively, when the smart card is inserted in the smart card port 112. Although four smart card contacts 206a-d are depicted in FIG. 2, any suitable number of smart card contacts can be selected for the intended task, such as, e.g., eight depicted in FIG. 3.

During use, different smart cards may be removed from, and inserted into, satellite receiver 101. In a household, for example, different members may have different television channels that their smart cards can access, or certain users may by allowed only a certain amount of use of the satellite receiver 101 (and the associated television 104) each week. Any card, chip, or other device that provides similar interactive capabilities with a host device as described herein is intended to be within the scope of the smart card of the present invention. Any host device capable of interacting with a smart card, such as a television set-top cable or satellite box, flash memory modules used in digital cameras, so-called MP players, etc. are within the intended scope of the present invention.

Two problems exist relative to the above-mentioned smart card 108 and host device 101 configuration that a port cover 302, shown in FIG. 3 and described below, is intended to overcome. A first electromagnetic interference (EMI)/radio frequency interference (RFI) shielding problem results from the EMI or RFI produced by the satellite receiver 101. Typically, the housing 121 of satellite receivers 101 are formed to shield electromagnetic radiation. The smart card port 112 however defines a breach in the EMI/RFI shielding by which the EMI/RFI can escape form the host device or satellite receiver 101. Such a breach in the EMI/RFI shielding in the satellite receiver severely limits the approval of the satellite receiver 101 by appropriate governmental communication radiation regulatory agencies.

A second, security related, problem with smart cards results when any unauthorized smart card user attempts to access either the host device or information contained in the smart card. The fact that the smart card operating patch 109 is physically located within the satellite receiver 101 as shown in FIG. 1 is a first effort to limit unauthorized users from gaining access to the information contained within the smart card, when the smart card 108 is positioned within the satellite receiver 101 by limiting unauthorized users access to the smart card contacts 206a-d. One technique by which unauthorized users gain access to information contained within the smart card 108 is to electrically connect a distinct, appropriately sized, electrically conductive wire (referred to herein as hot-wired wire 212 depicted in FIG. 2) to each distinct smart card contact 202a, 202b, 202c, and 202d. Thus, when the smart card 108 is inserted into the smart card port causing each smart card contact 202 to contact the respective reader head contact 206, then any signal transmitted between the smart card reader head 111 and the smart card 108 could be read at the other end of the hot-wired wire 212, which would extend out of the smart card port 112. This unauthorized accessing of information contained in the smart card is referred to herein as "hot-wiring" the smart card.

Port Cover

Port cover 302 is mounted over smart card port 112 after the smart card is inserted into the smart card port. The use of the port cover 302 has two primary functions. First, the port cover 302 limits EMI (including RFI) that can escape from the EMI/RFI shield after the port cover is in place. Second, the port cover 302 limits the use of the host device (e.g. satellite receiver 101) if the smart card 108 is being hot-wired. With the port cover 302 in place, the remote end of the hot-wired wires 212 cannot physically extend from within the satellite receiver 101, through the smart card port cover 302, to outside of the satellite receiver. The port cover 302 is preferably configured as a snap-on, electroless metal plated plastic cover. The port cover 302 is configured to cover the port while a National Renewable Security Standard (NRSS) smart card 108, or the like, is installed therein.

Port cover 302 includes body portion 303, peripheral mounting surface 304 coupling pads 306a and 306b, mounting flanges 308, and small spherical bumps 416. Body portion 303 forms the cover to limit access into the smart card port 112. Body portion 303, depicted in FIG. 3, includes bottom portion 330, and multiple side portions 330, 334, 336 that extend from the peripheral mounting surface 304 to the bottom portion 330. The bottom portion 330, side portions 330, 334, and 336, and peripheral mounting surface (when the port cover 302 is installed) define an enclosure that combines with the satellite receiver 101 to delineate an interior space where the satellite receiver 101 components are located from an outside space 322. Radiation contained within the interior space is shielded from passing into the outside space 322. A peripherally extending surface 309 is formed in the housing 121 and extends around the periphery of the smart card port 112. A peripheral mounting surface 304 mounts with the periphery extending surface 309 in a manner that no wires can extend between the two surfaces when the port cover 302 is installed.

Coupling pads 306a, 306b have two functions. First, each distinct coupling pads 306a, 306b enter into a distinct mating recesses 310 to securely position the port cover 302 over smart card port 112. Second, coupling pad 306a contacts electrical source contact (not depicted but contained in first mating recess 310 that coupling pad 306a engages with) while coupling pad 306b contacts electrical drain contact (not depicted but contained in second mating recess 310 that coupling pad 306b engages with) causing an electrical voltage to be applied as described below. Mounting flanges 308 also extend into recesses 314 to assist in securing the port cover 302 to the peripherally extending surfaces 309. Port cover 302 is preferably formed form a resilient plastic that permits the coupling pads 306a, 306b, and the mounting flanges 308 to be displaced relative to each other as a result of a moderate biasing force. This relative displacement permits the coupling pads to be inserted into the mating recesses 310, and the mounting flanges 308 to be inserted into the recesses 314 to a position where tangs 340 snap back into position and secure the port cover in position covering the entire port cover. When the tangs 340 are securing the port cover in position, release portions 342 may be pressed to deflect the tangs, and release the coupling pads 308 from the mating recesses 310 while the mounting flanges 308 are removed from recesses 314. Small spherical bumps 416 extend from the peripheral mounting surface 304 to ensure grounding of the peripheral mounting surfaces 304 to the peripherally extending surface 309, thereby grounding port cover 302 to housing 121.

Formed in housing 121 of satellite receiver 101 is EMI/RFI shield 320. However, the EMI/RFI shield 320 does not extend over smart card port 112 which defines a breach in the EMI/RFI shield. To limit escape of EMI/RFI that passes through smart card port 112 into the surrounding environment (depicted as 322 in FIG. 3), port cover 302 is provided with EMI/RFI cover shielding 322, which is selected to be a suitable material to shield the EMI or RFI that is likely to be produced within the satellite receiver 101. As the port cover is positioned such that: a) coupling pads 306a, 306b are positioned within mating recesses 310, b) mounting flanges 308 are positioned into recesses 314, and c) peripheral mounting surface 304 abuts peripherally extending surface 309; then EMI/RFI enclosure 324 is formed within EMI/RFI cover shield 322 that limits passage of EMI and/or RFI from within the EMI/RFI cover shield to the surrounding environment 322.

The use of hot-wired wires by hackers to tamper with or access information contained on smart card 108 has been described above. There are two embodiments of port covers 302 depicted in FIGS. 3, 4, and 5 that limit the use of hot-wired wires 212. In considering the two embodiments of port covers 302, FIG. 3 should be viewed in combination with FIG. 4 for the first embodiment. FIG. 3 should be viewed in combination with FIG. 5 when considering the second embodiment.

Figure 4:
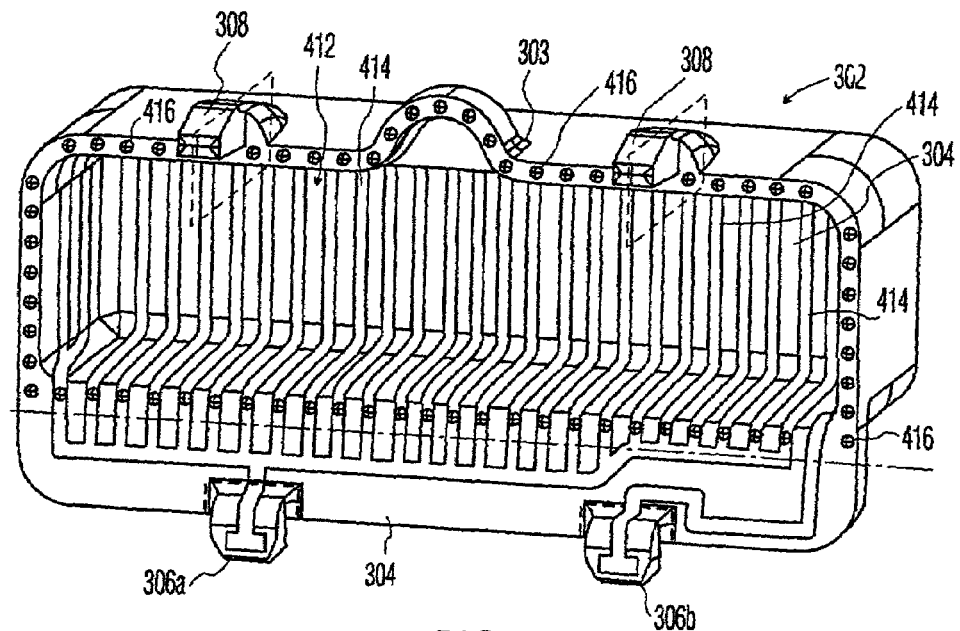
FIG. 4 shows a perspective view of one embodiment of the port cover of FIG. 3.
Figure 5:
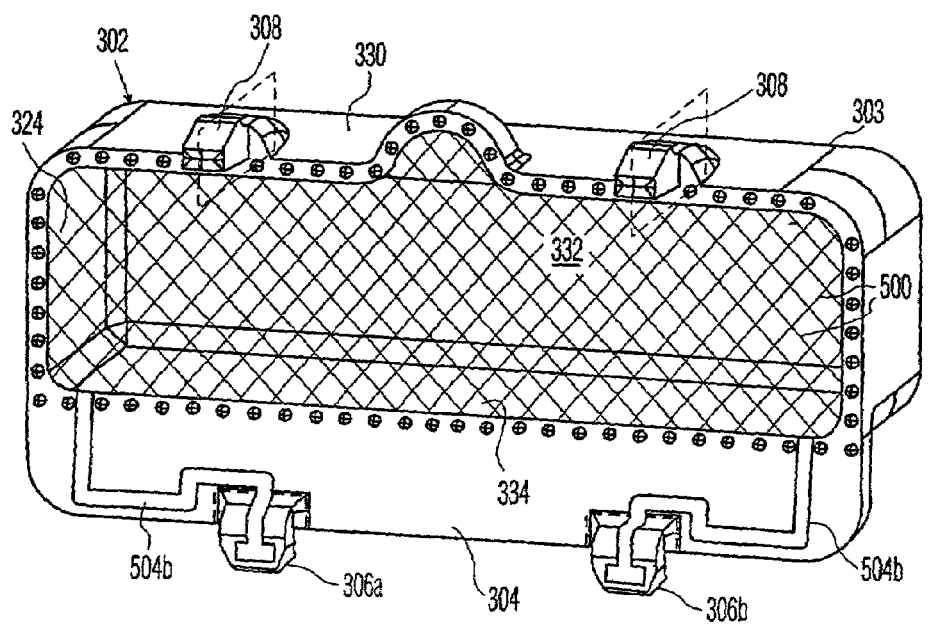
FIG. 5 shows a perspective view of an alternate embodiment of the port cover 302 of FIG. 3.

There are two distinct embodiments of the present invention depicted in FIGS. 4 and 5, respectively. Both embodiments of the present invention limits access of information across the hot-wired wire to a remote end of the hot-wired wire from the contact 202a, via the smart card port 112 to a location outside the port cover 302. Since the entire length of the hot-wired wire 112 would be either positioned within either the host device; e.g., the satellite receiver 101, or the port cover 302, a hacker is restricted from accessing a hot-wired wire 212 when the port cover 302 is in place.

The first embodiment of the present invention (depicted in FIG. 4) involves the use of a conductor trace 412. Conductor trace 412 functions to limit an unauthorized user from drilling through the port cover 302 such that hot-wired wires 212 can be passed through the holes in port cover 302. The conductor trace covers top portion 330, front portion 332, bottom portion 334, and the two side portions 336. The conductor trace 412 is to be configured such that if a hacker drills through the port cover 302 at any location that might provide access for the hot-wired wires 212, then at least one individual conductor 414 in conductor trace 412 will be severed. The individual conductors 414 of the conductor trace 412 are preferably arranged in parallel. Therefore, severing of any of the individual conductor(s) 414 will alter the electrical characteristics (e.g., the impedance) of the entire conductor trace 412. Therefore, the conductor trace can be monitored for changes in impedance, indicating tampering of port cover 302. Additionally, if port cover 302 is not positioned over smart card port 112, then the coupling pads 306a and 306b will not engage with mating recess 310 and electric current will not pass between the two mating recesses 310 associated with two coupling pads 306a and 306b.

It is preferable for the conductors to form conductor trace 412 to cover as much of the surface area of port cover 302 as possible, with as little spacing between the individual conductors 414 of the conductor trace as possible. This will limit the possibility that a hacker will be able to drill between the individual conductors 414 forming the conductor trace 412 in that the hacker may attempt to cut or drill around the individual conductors, if they can see where they are located.

There are a variety of techniques by which conductor trace 412 is formed. In a first conductor trace formation technique, the conductors are applied to the port cover via selective plating or conductive powder coating. In selective plating, a conductive material is plated onto the surface of the port cover 302. A conductive material that can adhere to the material that the port cover is formed from (preferably plastic), is required. In conductive powder coating, an adhesive (not shown) following the outline of the individual conductors is placed on the desired surfaces of the port cover 302, and a powder formed from a conductive material is applied to the adhesive. The conductive powder "sticks" to the adhesive, thereby forming the conductors in the conductor trace 412. In an alternate embodiment, the individual conductors 414 of the conductor trace 412 are affixed to the port cover 302 by a resin such as epoxy. The surface above the individual conductors of the conductor trace 412 should be painted so backers cannot determine the precise positioning of the individual conductors 414 in the conductor trace 412. The technologies used to form the conductor trace are generally known, and will not be further detailed herein. Any known technique by which a conductor trace 412 is applied to port cover 302 is within the scope of the present invention.

Even though the term "electric current" is used in this specification and the associated claims, it is intended that related electrical measurements such as electric voltage, electrical voltage or current of a prescribed frequency or waveform, etc., are within the scope of the present invention. It is also envisioned that magnetic characteristics can be measured across the conductor trace 412 using known detector systems that can interface with controller 107. The conductor trace 412 may be configured as either an active or passive circuit. However, any technique that securely attaches, or forms, the individual conductors 414 to the port cover 302 is within the intended scope of the present invention.

In the second embodiment of applying conductor trace 412 to port cover 302 (depicted in FIG. 5 as taken relative to FIG. 3), the conductor trace 412 in the FIG. 4 embodiment is replaced by conductive plating 500 (shown by shading) applied to the port cover 302. More specifically, the conductive plating extends over top portion 330, front portion 332, bottom portion 334, and the two side portions 336. The conductive plating 500 is connected by insulated conductors 504a, 504b to coupling pads 306a, 306b, respectively. Alternatively, the above-described conductive plating and conductive powder technologies, described relative to the FIG. 4 embodiment, may be applied in this embodiment as well to form a substantially continuous conductor over the port cover 302. Insulated conductors 504a and 504b are depicted as attached to the surface of peripheral mounting surface 304 in FIG. 5, however the insulated conductors may actually be integrated in port cover 302. Conductive plating has empirically determinable electrical resistivity characteristics that are altered by tampering, such as cutting through, or drilling in, the body portion 303. Inner or outer surfaces of conductive plating 500 may contain an insulative coating (not shown) to limit grounding of the conductive plating 500 to the port cover 302. This insulative coating is not necessary if the port cover 302 is formed from an insulative plastic. As a result of such cutting or drilling in the body portion 303, which will necessarily cause similar cutting or drilling of the conductive plating 500 that plates the body portion 303, the electrical characteristics of the conductive plating 500 will be altered. This altering of the electrical characteristics of the conductive plating 500 can be sensed as a varying impedance, resistance, or other measurement in a similar manner that the electrical characteristics of the electrical trace 412 was altered in the FIG. 4 embodiment when individual conductors were severed.

Figure 3:
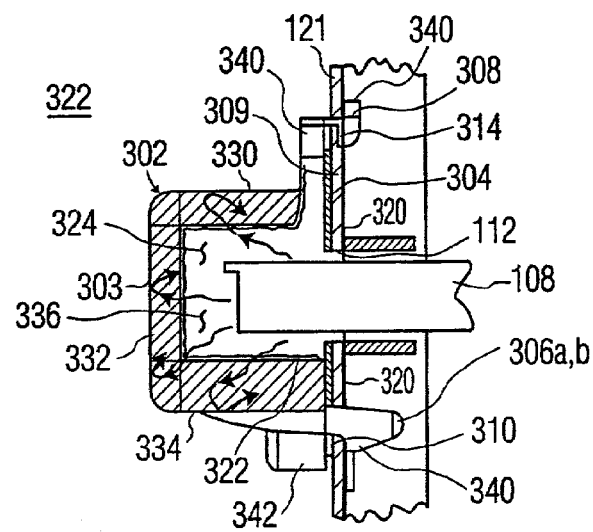
FIG. 3 shows a partial cross-sectional view of one embodiment of a port cover in accordance with the present invention.

The FIGS. 3 and 4 port cover embodiment, as well as the FIGS. 3 and 5 port cover embodiment, may be controlled by controller 107 as depicted in FIG. 1. Considering the above disclosure, controller 107 may encounter three possible alternative conditions relating to the electric level of the electric contacts formed in mating recess 310 (not shown):

a) when no electric current is sensed between the electric contacts formed in the two mating recesses 310, controller 107 determines that there is no port cover 302 in place. Under these conditions, controller 107 will not interact with the smart card 108;

b) when a predetermined limit of electric current is sensed between the electric contacts formed in the two mating recesses 310, controller 107 determines that the port cover is in place, and none of the individual conductors 414 in the conductor trace 412 have been tampered with. Under these circumstances, controller 107 will interact with the smart card 108; or c) when some range of electric current between the "no electric current" sensed in part a) and the "predetermined limit" of part b) is sensed between the electric contacts formed in the two mating recesses 310, controller 107 determines that at least one of the individual conductors 414 in the conductor trace 412 have been tampered with (e.g., a conductor has been damaged, presumably by drilling or cutting through the port cover 302). Under these circumstances, controller 107 will not interact with the smart card 108.

The level of the predetermined limit is based on the specific circuit, and is preferably determined empirically.

Though various embodiments which incorporate the teachings of the present invention have been shown and described in detailed herein, those skilled in the art can readily devise many other varied embodiments that still incorporate these teachings.

The invention claimed is:

1. A method of securing information being transferred from an information-storing device to a host device, the method comprising:

providing a port formed in the host device, the port allowing the information-storing device to be inserted into and removed from the host device by a user;

providing a port cover having a conductor formed therein along a path substantially encompassing an area between spaced edges of the port cover, wherein the port cover is moveable between a first position in which the port cover blocks the port and a second position in which the port cover enables access to the port;

positioning the port cover over the port and coupling it to the host device so as to block the port and place the port cover in the first position;

supplying an electric signal to the conductor formed in the port cover; and monitoring the electric signal to ensure that the port cover is correctly placed in the first position.

2. The method set forth in claim 1, further comprised of limiting interaction by the host device with the information-storing device if the monitored electric signal exceeds a predetermined parameter.

3. The method set forth in claim 1, wherein the host device is a satellite receiver.

4. An apparatus for use with a smart card, the apparatus comprising:

a host device capable of accessing information stored in the smart card, the host device including a housing having a port formed therein, the port allowing the smart card to be inserted into and removed from the host device by a user, wherein when the smart card is inserted into the port, information can be transferred from the smart card to the host device;

a port cover removably coupled to the housing surrounding the port, wherein the port cover is adapted to be moveable back and forth between a first position in which the port cover physically blocks the port and a second position in which the port cover does not physically block the port; and wherein the port cover comprises at least one conductor that is coupled to the host device and is operable for at least one of providing an electromagnetic shield across the port and enabling the host device to detect if the port cover is placed in the first position.

5. The apparatus set forth in claim 4, wherein a date stream can be transferred between the smart card and the host device when the smart card is inserted into the port and the port cover is placed in the first position.

6. The apparatus set forth in claim 4, wherein when the port cover is in the first position, electrical wires electrically connected to the smart card are limited from extending through the port from within the host device to outside of both the host device and the port cover.

7. The apparatus set forth in claim 4, wherein the housing includes a mounting flange extending peripherally from the port, wherein when the port cover is attached to the mounted flange and placed in the first position, the port cover covers the entire port such that the housing and the port cover define an enclosure.

8. The apparatus set forth in claim 4, wherein:

an electric sensor senses a breach of the at least one conductor; and a limiting device limits operation of the host device when the at least one conductor is breached.

9. The apparatus set forth in claim 4, wherein the at least one conductor comprises a plurality of wires arranged in parallel extending across the port cover.

10. The apparatus set forth in claim 4, wherein the at least one conductor comprises a conductive plate.

* * * * *